United States Patent
Lerner et al.

(10) Patent No.: US 11,692,261 B2
(45) Date of Patent: Jul. 4, 2023

(54) EVAPORATOR CHAMBER FOR FORMING FILMS ON SUBSTRATES

(71) Applicant: Applied Materials, Inc., Santa Clara, CA (US)

(72) Inventors: Alexander N. Lerner, San Jose, CA (US); Roey Shaviv, Palo Alto, CA (US); Satish Radhakrishnan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 2 days.

(21) Appl. No.: 16/923,600

(22) Filed: Jul. 8, 2020

(65) Prior Publication Data

US 2021/0025048 A1  Jan. 28, 2021

Related U.S. Application Data

(60) Provisional application No. 62/878,918, filed on Jul. 26, 2019.

(51) Int. Cl.
| | |
|---|---|
| *C23C 14/24* | (2006.01) |
| *C23C 14/04* | (2006.01) |
| *C23C 14/50* | (2006.01) |
| *C23C 16/455* | (2006.01) |

(52) U.S. Cl.
CPC ............ *C23C 14/24* (2013.01); *C23C 14/042* (2013.01); *C23C 14/505* (2013.01); *C23C 16/45565* (2013.01)

(58) Field of Classification Search
CPC .. C23C 16/45565; C23C 14/505; C23C 14/24
USPC .................................................. 156/345.34
See application file for complete search history.

(56) References Cited

U.S. PATENT DOCUMENTS

| | | | | |
|---|---|---|---|---|
| 5,876,503 | A | * | 3/1999 | Roeder ................. C23C 16/409 118/715 |
| 5,997,649 | A | * | 12/1999 | Hillman ............ C23C 16/45565 118/715 |
| 6,126,753 | A | * | 10/2000 | Shinriki ............ C23C 16/45565 118/715 |

(Continued)

FOREIGN PATENT DOCUMENTS

| | | |
|---|---|---|
| JP | H11-323560 A | 11/1999 |
| JP | 2000-507649 A | 6/2000 |

(Continued)

OTHER PUBLICATIONS

International Search Report and Written Opinion in related application PCT/US2020/041155 dated Oct. 30, 2020.

(Continued)

*Primary Examiner* — Aiden Lee
(74) *Attorney, Agent, or Firm* — Patterson + Sheridan, LLP (57) ABSTRACT

One or more embodiments described herein generally relate to methods and systems for forming films on substrates in semiconductor processes. In embodiments described herein, process chamber is provided that includes a lid plate having a plurality of cooling channels formed therein, a pedestal, the pedestal having a plurality of cooling channels formed therein, and a showerhead, wherein the showerhead comprises a plurality of segments and each segment is at least partially surrounded by a shield.

17 Claims, 4 Drawing Sheets

(56) References Cited

U.S. PATENT DOCUMENTS

| | | | | |
|---|---|---|---|---|
| 6,183,564 | B1* | 2/2001 | Reynolds | H01L 21/6719 156/345.31 |
| 6,309,465 | B1* | 10/2001 | Jurgensen | C23C 16/4412 118/715 |
| 6,319,553 | B1* | 11/2001 | McInerney | C23C 16/4412 427/337 |
| 2001/0042799 | A1* | 11/2001 | Kim | H01L 21/67069 239/128 |
| 2008/0141939 | A1 | 6/2008 | Gillard et al. | |
| 2009/0275210 | A1* | 11/2009 | Shanker | H01J 37/32357 438/761 |
| 2012/0006493 | A1 | 1/2012 | White et al. | |
| 2012/0077338 | A1 | 3/2012 | Shanker et al. | |
| 2012/0193456 | A1 | 8/2012 | Lubomirsky et al. | |
| 2014/0263275 | A1* | 9/2014 | Nguyen | G01K 13/08 374/179 |
| 2015/0376786 | A1* | 12/2015 | Yudovsky | C23C 16/455 118/730 |
| 2016/0047042 | A1* | 2/2016 | Higashi | H01J 37/32834 239/548 |
| 2019/0382890 | A1 | 12/2019 | Lerner et al. | |
| 2020/0048767 | A1 | 2/2020 | Kothnur et al. | |
| 2020/0087790 | A1 | 3/2020 | Lerner et al. | |
| 2021/0025048 | A1* | 1/2021 | Lerner | C23C 16/4411 |

FOREIGN PATENT DOCUMENTS

| | | | |
|---|---|---|---|
| JP | 2001-262352 | A | 9/2001 |
| JP | 2001-520708 | A | 10/2001 |
| JP | 2007-162081 | A | 6/2007 |
| JP | 2009-049061 | A | 3/2009 |
| JP | 2010-538168 | A | 12/2010 |
| JP | 2011-520035 | A | 7/2011 |
| JP | 2017-224825 | A | 12/2017 |
| JP | 2018-082063 | A | 5/2018 |
| JP | 2018-113452 | A | 7/2018 |
| KR | 1020060083793 | A * | 7/2006 |
| KR | 1020100128795 | A * | 12/2010 |
| KR | 1020150009445 | A * | 1/2015 |

OTHER PUBLICATIONS

Office Action from TW Application No. 109124928 dated Apr. 10, 2023.

Japan Office Action dated May 9, 2023, for JP Application No. 2022-503777.

* cited by examiner

EVAPORATOR CHAMBER FOR FORMING FILMS ON SUBSTRATES

CROSS-REFERENCE TO RELATED APPLICATION

This application claims benefit of U.S. Provisional Patent Application Ser. No. 62/878,918, filed Jul. 26, 2019, which is hereby incorporated by reference herein.

BACKGROUND

Field

One or more embodiments described herein generally relate to semiconductor processes, and more particularly, to methods and systems for forming films on substrates in semiconductor processes.

Description of the Related Art

Organic vapor deposition is becoming increasingly relevant in building semiconductor devices and other optical devices. Vapor deposition processes generally include heating materials that are maintained at a desired pressure to a desired temperature such that the heated material is vaporized and then allowed to be transferred to a substrate where the vaporized material condenses onto a surface of the substrate. Organic vapor deposition is often used to form CMOS image sensors. However, organic vapor deposition can also be used to form organic light emitting diodes (OLEDs) organic photodetectors, solar cells, and other similar devices. These devices are used in the manufacture of television screens, computer monitors, mobile phones, and other hand-held devices for displaying information. The range of colors, brightness, and viewing angles possible with OLED displays are greater than that of traditional LED displays because OLED pixels directly emit light and do not require a back light, and thus lesson the energy consumption of the formed device. Further, OLEDs can be manufactured onto flexible substrates, resulting in further device applications as well.

Although these devices are useful, there are many challenges encountered in their manufacture. To fabricate the stacks with high efficiency, the co-deposition of materials is often desired. When co-depositing materials onto a substrate, the placement of the materials on the surface of the substrate is important to assure that the resulting film layer(s) on the substrate are able to form a functioning device. Without the control of the placement of the materials, the resulting deposited materials within a formed layer may form undesirable domain sizes and morphologies that impedes charge separation and extraction in organic electronic devices. In some device configurations, it is desirable to deposit the materials onto a substrate such that multiple materials mix within a single formed layer or the multiple materials form a superlattice structure. However, conventional vapor deposition processes are not able to reliably form these types of multiple material containing layers, or composite layers.

Accordingly, there is a need for methods and apparatus for forming films on a substrate with multiple materials.

SUMMARY

One or more embodiments described herein generally relate to methods and systems for forming films on substrates in semiconductor processes. In embodiments described herein, a process chamber is provided that includes a lid plate having a plurality of cooling channels formed therein, a pedestal, the pedestal having a plurality of cooling channels formed therein, and a showerhead, wherein the showerhead comprises a plurality of segments and each segment is at least partially surrounded by a shield.

In another embodiment, a system for processing a substrate is disclosed that includes a chamber body, a lid plate having a plurality of cooling channels formed therein, a rotatable pedestal, the pedestal having a plurality of cooling channels formed therein, a showerhead disposed above the rotatable pedestal, a plurality of fluid delivery lines coupled to a showerhead, and one or more vacuum pumps coupled to the chamber body and each of the plurality of fluid delivery lines.

In another embodiment, a method for depositing a film on a substrate is disclosed that includes positioning a substrate on a substrate support in a chamber, the chamber having a plurality of heated fluid delivery lines coupled to a showerhead, positioning a mask over the substrate, and flowing a vaporized fluid through the plurality of heated fluid delivery lines. The flowing the vaporized fluid comprises closing a by-pass valve in one of the plurality of heated fluid delivery lines, the by-pass valve positioned between a vacuum pump and the chamber, opening a flow valve of the one of the plurality of heated fluid delivery lines, and flowing the vaporized fluid to the showerhead. The method further includes closing the flow valve of the one of the plurality of heated fluid delivery lines, opening the by-pass valve of the one of the plurality of heated fluid delivery lines, and purging the one of the plurality of heated fluid delivery lines.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

One or more embodiments described herein generally relate to methods and apparatus for forming films on substrates in one or more deposition processes. In embodiments described herein, a process system includes the same or different evaporable materials that are each contained in separate ampoules. Each evaporable material flows into a separate portion of a showerhead contained within a process chamber via a heated gas line. From the showerhead, each material is directed onto a substrate that sits on the surface of a rotating pedestal. Controlling process parameters of the process system while the materials flow from the ampoules to the substrate can result in multiple materials mixed within a single formed layer or multiple materials forming a superlattice structure. By controlling the process parameters, the relative composition of a formed layer that includes multiple deposited materials can also be achieved.

In embodiments described herein, some parameters that affect the composition of the resulting films across the surface of the substrate are the mass flow rate out of the showerhead, the temperature of the substrate, and the rotation rate of the pedestal. Some factors that determine the mass flow rate out of the showerhead are the temperature of the ampoule that is connected to the showerhead, the temperature gradient formed in the fluid delivery system extending from the ampoules to the showerhead, the temperature of the showerhead, the flow restriction created by openings within each showerhead portion, the flow regime (e.g., molecular flow) of the material within different portions of the process system, and the pressure of the process chamber in which the substrate resides during processing. Controlling the mass flow rate and the rotational speed of the pedestal results in a deposition process that is able to form films with desirable compositions on the surface of the substrate. As such, the resulting films have desired domain sizes and morphologies, solving the problem of resulting films having undesired domain sizes and morphologies that impedes charge separation and extraction in organic electronic devices.

Figure 1:
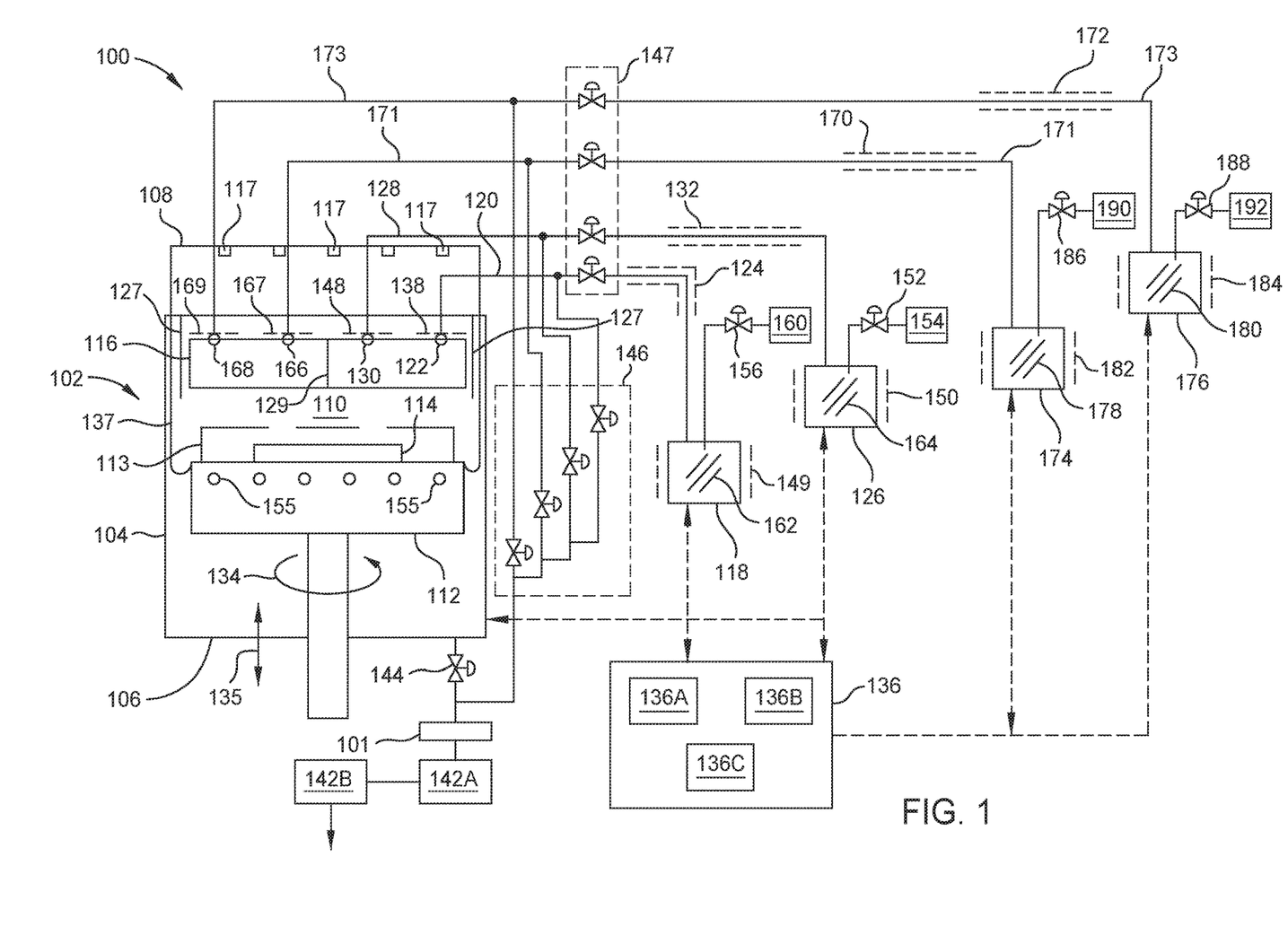
FIG. 1 is schematic view of a process system according to at least one embodiment described herein.

FIG. 1 is a schematic view of process system 100 according to at least one embodiment described herein. The process system 100 includes a process chamber 102. The process chamber 102 is defined by side walls 104, a bottom 106, and a chamber lid 108, forming a process volume 110. The process chamber 102 is configured to process a substrate, such as a substrate 114, within the process volume 110 of the process chamber 102. The substrate 114 is supported by a pedestal 112 disposed in the process chamber 102. A mask 113 with openings is positioned above the substrate 114. The mask 113 is positioned such that the materials flow onto separate regions of the substrate 114, forming suitable devices. In some embodiments, the process chamber 102 may be a chemical vapor deposition (CVD) chamber, atomic layer deposition (ALD) chamber, or physical vapor deposition (PVD) chamber configured to perform process material deposition such as organic vapor deposition in accordance with the present disclosure. However, other chambers can also be used and modified with the teachings provided herein.

In some embodiments, a material layer (not shown), or derivatives thereof may be formed, condensed, or deposited by a deposition process on the substrate 114 by separately controlling the mass flow rate of each of the materials, which each require different evaporation temperatures. As such, embodiments herein cannot be evaporated through a conventional showerhead. In some embodiments, some of material combinations used can be a CuPc:C60 mix; a CBP:Ir (ppy)3 mix; a MoO3:Ag mix; a distributed Bragg reflector (DBR) superlattice structure (MgF2/SiOx pairs for example), and/or other similar combinations. However, in embodiments described herein, a showerhead 116 is provided that includes a first segment 122, a second segment 130, a third segment 166, and a fourth segment 168. Although four segments are shown in FIG. 1, other showerheads can be provided that include any number of segments. Using the multiple segments, the showerhead 116 is configured to deposit multiple process materials to form desirable films on the substrate 114, which is described in more detail below.

The chamber lid 108 is positioned above the showerhead 116. The chamber lid 108 includes a plurality of fluid channels 117 formed therein. The fluid channels 117 are utilized to flow a coolant, such as water, ethylene glycol, or other suitable coolant, therein. The chamber lid 108 is at least partially utilized to control temperatures of the process chamber 102, portions of the showerhead 116 and other components coupled to the chamber lid 108.

As shown in FIG. 1, the process system 100 includes a first ampoule 118, a second ampoule 126, a third ampoule 174, and a fourth ampoule 176. A first material 162 is contained within a process volume of the first ampoule 118, a second material 164 is contained within a process volume of the second ampoule 126, a third material 178 is contained within a process volume of the third ampoule 174, and a fourth material 180 is contained with a process volume of the fourth ampoule 176. The first ampoule 118 delivers the first material 162 to the first segment 122 of the showerhead 116 via a first delivery line 120, the second ampoule 126 delivers the second material 164 to the second segment 130 of the showerhead 116 via a second delivery line 128, the third ampoule 174 delivers the third material 178 to the third segment 166 of the showerhead via a third delivery line 171, and the fourth ampoule 176 delivers the fourth material 180 to the fourth segment 168 of the showerhead 116 via a fourth delivery line 173. Although four ampoules are shown in FIG. 1, other embodiments can include any number of ampoules, each containing its own process material and each delivering the process material to a separate segment of a showerhead (e.g., the showerhead can contain as many separated segments as different materials provided). Additionally, in other embodiments, two opposing segments of the showerhead 116 can connect to the same ampoule to deposit the same material. While not shown in FIG. 1, in one example, the first segment 122 and the third segment 166 of the showerhead 116 can be connected to the same ampoule, such as the first ampoule 118, via the first delivery line 120 to deposit the first material 162 on a substrate. In this example, the second segment 130 and the fourth segment 168 can be connected to the second ampoule 126, via the second delivery line 128, to deposit the second material 164 on the substrate.

In these embodiments, the temperature in the process system 100 is controlled by heating elements contained in different parts of the system. For example, in some embodiments, the first delivery line 120 is heated by a first delivery line heating element 124, the second delivery line 128 is heated by a second heating element 132, the third delivery line 171 is heated by a third delivery line heating element 170, and the fourth delivery line 173 is heated by a fourth delivery line heating element 172. Each of the first delivery line heating element 124, the second delivery line heating element 132, the third delivery line heating element 170, and the fourth delivery line element 172 help heat the first delivery line 120, the second delivery line 128, the third delivery line 171, and the fourth delivery line heating element 172, preventing unwanted condensation. Similarly, the first ampoule 118 is heated by a first ampoule heating element 149, the second ampoule 126 is heated by a second ampoule heating element 150, the third ampoule 174 is heated by a third ampoule heating element 182, and the fourth ampoule 176 is heated by a fourth ampoule heating element 184. Likewise, the first segment 122 of the showerhead 116 is heated by a first segment heating element 138, the second segment 130 of the showerhead 116 is heated by a second segment heating element 148, the third segment 166 of the showerhead 116 is heated by a third segment heating element 167, and the fourth segment 168 of the showerhead 116 is heated by a fourth segment heating element 169.

One or more shields 127 are positioned about a perimeter of the showerhead 116. Each of the shields 127 are made of a thermally conductive material, such as aluminum, stainless steel, or other metals. At least one surface of the shields 127 is reflective. For example, an inner surface of the shields 127 is reflective in order to contain thermal energy from the showerhead 116 and reflect the energy back toward the showerhead 116. The reflective surface(s) have a reflectivity of about 0.1 to about 0.2.

The shields 127 are in thermal communication with the chamber lid 108. Thermal energy that is not reflected back to the showerhead 116 is absorbed by the shields 127. However, the shields 127 are cooled by cooling fluid flowed in the chamber lid 108. Each of the shields 127 has a center wall 129. The center wall 129 is positioned between adjacent segments of the showerhead 116. While not shown in FIG. 1, the shields 127 have a top wall that covers the upper surface of the showerhead 116. Each of the center walls 129 are coupled to the top wall (not shown).

To enable temperature control of the substrate 114, the pedestal 112 includes a plurality of coolant channels 155. The coolant channels 155 are utilized to flow a coolant, such as water, ethylene glycol, or other suitable coolant, therein. Typically, the temperature of the substrate is maintained cold enough such that there is no effect on film composition. Temperatures of the substrate may be maintained at about 0 degrees Celsius to about 70 degrees Celsius.

Controlling the temperature throughout different portions of the process system 100 can be used to control the mass flow rate throughout different portions of the process system 100. When the temperature is increased, it causes an increase in the flow rate of the vaporized material in an open system due to a decrease in density of the vaporized material. When the temperature is decreased, it causes a decrease in flow rate due to an increase in density of the vaporized material. In embodiments described herein, the mass flow rate can be controlled without the use of a carrier gas. However, in other embodiments, carrier gases can be optionally provided.

In some embodiments, the pressure in the process system is controlled by one or more vacuum pumps 142A and 142B, and a valve 144. The vacuum pump 142A may be a turbo pump and the vacuum pump 142B may be a rough pump. The vacuum pumps 142A, 142B are utilized to remove process gases and air from the process system 100. The vacuum pumps 142A, 142B are connected to the process chamber 102, and reduce the pressure within the process chamber 102 when the valve 144 is open. In some configurations, a cold trap 101 is used to capture unreacted precursor materials before entering the vacuum pumps 142A, 142B. In some embodiments, the vacuum pumps 142A, 142B are also connected to each of the delivery lines 120, 128, 171, and 173 through a dedicated by-pass valve 146 disposed in each of the delivery lines 120, 128, 171, and 173. In some embodiments, pressure in the system is maintained at about $10E^{-04}$ Torr (about 0.1333 Pascals) to about $10E^{-10}$ (about $1.333E^{-7}$ Pascals).

In some embodiments, each delivery line 120, 128, 171, and 173 has a dedicated flow valve or shut-off valve, which is illustrated in FIG. 1 as a plurality of shut-off valves 147. Typically, the shut-off valves 147 are each used to separately control which of the materials 162, 164, 178, 180 flow from the ampoules 118, 126, 174, 176 into each segment 122, 130, 166, and 168 of the showerhead 116. For example, two of the shut-off valves 147 can be closed and two of the shut-off valves can be open, and thus prevent the flow of materials 162 and 180 into the showerhead 116, and allowing only materials 164 and 178 to flow into the showerhead 116. In another example, one of the shut-off valves 147 can be opened, while all of the other valves 147 are closed, thus allowing only the material 162 to flow into the showerhead 116. In another example, three of the shut-off valves 147 can be opened, and thus allow the flow of materials 162, 178, and 180 to flow into the showerhead 116, and thus preventing the second material 164 from flowing into the showerhead 116. In some cases it is desirable to close all of the shut-off valves 147, to prevent the flow of all materials of the materials 162, 164, 178, 180 into the showerhead 116 so that the substrate can be transferred into or out of the processing volume 110 or some maintenance activity can be performed on the process chamber. In other embodiments, all of the shut-off valves 147 can be opened, allowing all of the materials of the materials 162, 164, 178, 180 to flow into the showerhead 116.

As discussed above, each delivery line 120, 128, 171, and 173 has a dedicated by-pass valve 146 that allows each respective delivery line to be in direct communication with the vacuum pumps 142A, 142B. The by-pass valves 146 allow the evaporated materials 162, 164, 178, 180 to be individually removed from the segments 122, 130, 166, and 168 of the showerhead 116. Controlling which materials 162, 164, 178, 180 are removed from the showerhead 116 advantageously allows the deposition processes to start and stop quickly, preventing residuals from forming on substrates. For example, one of the by-pass valves 146 can be opened to allow a residual material 164 in a portion of the second delivery line 128 and the second segment 130 of the showerhead to be removed and provided to the vacuum pumps 142A, 142B. In another example, two of the by-pass valves 146 are opened to allow a residual material 162 and 178 found in portions of the first delivery line 120 and the third delivery line 171, respectively, and the first segment 122 and the third segment 166 of the showerhead, respectively, to be removed and provided to the vacuum pumps 142A, 142B. In another example, all of the by-pass valves 146 can be closed, stopping the flow of all materials of the materials 162, 164, 178, 180 out of the showerhead 116. In another example, all of the by-pass valves 146 can be opened, allowing all of the materials of the materials 162, 164, 178, 180 to be removed from the showerhead and delivery lines and provided to the vacuum pumps 142A, 142B.

Optionally, in some embodiments, a first push gas source assembly 160, a second push gas source assembly 154, a third push gas source assembly 190, and a fourth push gas source assembly 192 are provided to help deliver the vaporized material to the process volume of the process system 100. The first push gas source assembly 160 delivers a first push gas (e.g., inert gas, such as Ar, $N_2$, He) through the first delivery line 120 when a valve 156 is open. The second push gas source assembly 154 delivers a second push gas (e.g., inert gas, such as Ar, $N_2$, He) through the second delivery line 128 when a valve 152 is open. The third push gas source assembly 190 delivers a third push gas (e.g., inert gas, such as Ar, $N_2$, He) through the third delivery line 171 when a valve 186 is open. The fourth gas source assembly 192 delivers a fourth push gas (e.g., inert gas, such as Ar, $N_2$, He) through the fourth delivery line 173 when a valve 188 is open. The flowing of the push gas (i.e., carrier gas provides an option of evaporation using a carrier gas instead of evaporation using vapor pressure as described herein.

In one example of a process used to deposit a film using a portion of the fluid delivery system, while the shut-off valve 147 attached to the delivery line 120 is in an initial closed state and the by-pass valve 146 that is connected to the delivery line 120 is closed, the first ampoule 118, the delivery line 120 and segment 122 of the showerhead are each heated to a desired temperature. At this stage the pressure in the ampoule 118, delivery line 120 and process volume 110 are pumped down to a high equilibrium pressure. The desired temperatures of the first ampoule 118, the delivery line 120 and segment 122 of the showerhead include temperatures that cause the first material 162 to vaporize and remain a vapor in the delivery line 120. To initiate the deposition process the shut-off valve 147 attached to the delivery line 120 is opened and the by-pass valve 146 connect to the delivery line 120 remains closed, thus allowing the vaporized material to flow into the segment 122 of the showerhead and onto the a substrate disposed in the process volume. After a desired time has elapsed the shut-off valve 147 attached to the delivery line 120 is closed and the by-pass valve 146 that is connect to the delivery line 120 is opened to allow a residual material 162 found in portions of the first delivery line 120 and the first segment 122 of the showerhead to be removed and provided to the vacuum pumps 142A, 142B. In some cases it is desirable to purge the first delivery line 120 and the first segment 122 of the showerhead with an inert gas provided from the gas source 160 before the shut-off valve 147 is closed and the by-pass valve 146 is opened.

In these embodiments, the pedestal 112 is configured to rotate as shown by the arrow 134 in FIG. 1. Additionally, the pedestal 112 is configured to move vertically as shown by arrow 135. The pedestal 112 is controlled to rotate at a speed such that it achieves desired deposited film results on the surface of the substrate 114. The deposited materials within a formed layer can form suitable devices, such as OLEDs, photodetectors, solar cells, or other optical devices. Controlling the speed of the rotation of the pedestal 112 solves the problem of resulting films having undesired domain sizes and morphologies that impede charge separation and extraction in organic electronic devices. In some embodiments, the pedestal 112 is rotated at about 1 revolutions per minute (RPM) to about 60 RPM during a deposition process.

The pedestal 112 is shown in a processing position in FIG. 1, but may be lowered vertically to facilitate transfer of the substrate 114. A shroud 137 is positioned about the perimeter of the substrate 114 and/or the pedestal 112 in the processing position. The shroud 137 substantially, but not entirely, seals the process volume 110 during deposition. For example, the shroud 137 protects interior surfaces of the process chamber 102 that are outside of the process volume 110 from parasitic deposition while allowing suitable pressures to be maintained in the process volume 110. The shroud 137 includes a surface facing the substrate 114 that may be reflective. For example, an inner surface of the shroud 137 is reflective in order to contain thermal energy from the showerhead 116 in the process volume 110 and reflect the energy back toward the showerhead 116. The reflective surface(s) have a reflectivity of about 0.2 to about 0.5. The shroud 137 is in thermal communication with the chamber lid 108. Thermal energy that is not reflected back to the showerhead 116 is absorbed by the shroud 137. However, the shroud 137 is cooled by cooling fluid flowed in the chamber lid 108.

As discussed above, some parameters that affect the size of the regions formed within the resulting films are the mass flow rate out of the showerhead 116, pressure within the process volume 110, and the rotation rate of the pedestal 112. Some factors that determine the mass flow rate of material out of the showerhead 116 are the temperature in each of the first segment 122, the second segment 130, the third segment 166, and the fourth segment 168 of the showerhead 116, the flow rate of the material delivered to each of the first segment 122, the second segment 130, the third segment 166, and the fourth segment 168 of the showerhead 116, the flow regime within the material delivery components (e.g., molecular flow), the temperature of each of the first ampoule 118, the second ampoule 126, the third ampoule 174, and the fourth ampoule 176, the temperature gradient from each of the ampoules 118, 126, 174, 176 to the showerhead 116, and the pressure of the process chamber 102. Controlling these factors will determine the deposition rate of the material, resulting in films of desirable compositions formed on the surface of the substrate 114.

In some embodiments, each of the above factors can be controlled by a controller 136. The controller 136 is in communication with hardware contained within the entire process system 100, including hardware contained within the process chamber 102. The controller 136 may include a central processing unit (CPU) 136A, memory 136B, and support circuits (or I/O) 136C. The CPU 136A may be one of any form of computer processors that are used in industrial settings for controlling various processes and hardware (e.g., motors, valves, power delivery components, and other related hardware) and monitor the processes (e.g., processing time and substrate position or location). The memory 136B is connected to the CPU 136A, and may be one or more of a readily available memory, such as random access memory (RAM), read only memory (ROM), floppy disk, hard disk, or any other form of digital storage, local or remote. Software instructions, algorithms and data can be coded and stored within the memory 136B for instructing the CPU 136A. The support circuits 136C are also connected to the CPU 136A for supporting the processor in a conventional manner. The support circuits 136C may include conventional cache, power supplies, clock circuits, input/output circuitry, subsystems, and the like. A program (or computer instructions) readable by the controller determines which tasks are performable within the process system 100. The program may be software readable by the controller 136 and may include code to monitor and control, for example, the parameters that determine the mass flow rate out of the showerhead 116 and the rotation rate of the pedestal 112, as is described further below in FIG. 3.

Figure 2:
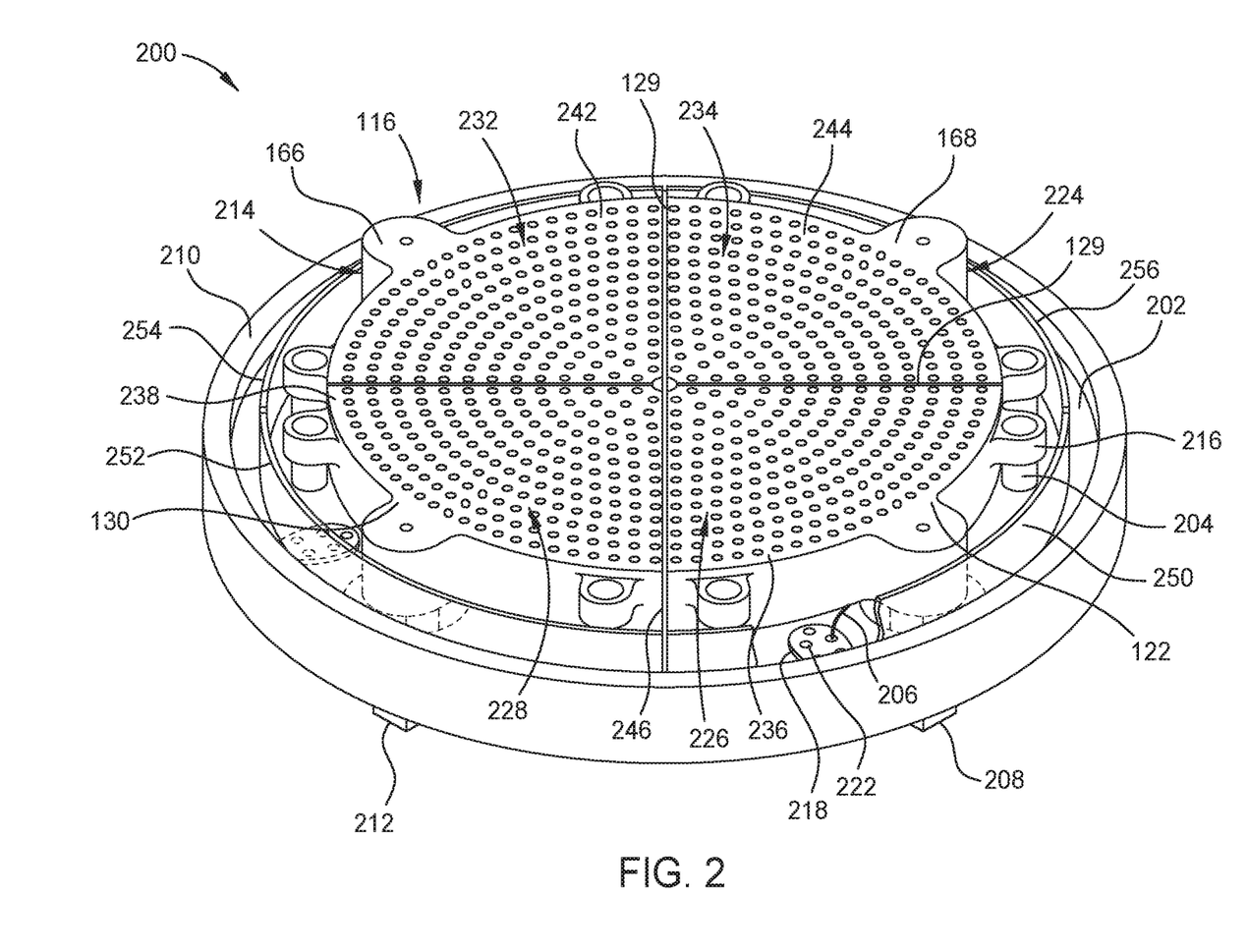
FIG. 2 is a bottom isometric view of the showerhead shown in FIG. 1 according to at least one embodiment described herein.

FIG. 2 shows a bottom isometric view of a showerhead assembly 200 according to at least one embodiment described herein. The showerhead assembly 200 includes the showerhead 116 and a lid plate 210. As shown, the showerhead 116 includes a plurality of segments including the first segment 122, the second segment 130, the third segment 166, and the fourth segment 168. The plurality of segments 122, 130, 166, and 168 can be coplanar and together form the showerhead 116 having a circular shape. In some embodiments, the showerhead diameter is about 300 mm to about 500 mm. In some embodiments, the showerhead diameter corresponds with a diameter of the substrate 114. In some embodiments, the plurality of segments can include three segments. In some embodiments, the plurality of segments can include six segments. The plurality of segments 122, 130, 166, and 168 are arranged such that there is a gap 246 between each segment. The spaced relation between the segments 122, 130, 166, and 168 advantageously reduces or prevents thermal cross-talk between each segment prior to exiting into the process chamber 102.

In some embodiments, the showerhead assembly 200 includes the showerhead 116 mounted to the lid plate 210. The lid plate 210 has a plurality of mounts 204 extending from a bottom surface 202 of the lid plate 210. Each of the segments 122, 130, 166, and 168 of the showerhead 116 include one or more mounts 216 that are capable of mating with corresponding mounts 204 of the lid plate 210 to couple the showerhead 116 to the lid plate 210. In some embodiments, the one or more mounts 216 extend from a radially outer surface of the showerhead 116. In some embodiments, the mounts 204, 216 are made of an insulative material.

In some embodiments, as shown in FIG. 2, the plurality of segments 122, 130, 166, and 168 are similar in size. In some embodiments, the plurality of segments may be different sizes. The first segment 122 includes a first inlet 208 extending through an opening in the lid plate 210. Similarly, the second segment 130, the third segment 166, and the fourth segment 168 include a second inlet 212, a third inlet 214, and a fourth inlet 224, each extending through an opening in the lid plate 210. In some embodiments, each inlet 208, 212, 214, 224 is disposed adjacent a respective outer portion of each gas delivery segment 122, 130, 166, and 168.

The first segment 122 includes a plurality of openings 226 formed in a bottom surface 236. The plurality of openings 226 are configured to deliver a process gas into the process chamber 102. The segments 130, 166, and 168 include a plurality of openings 228, 232, 234, respectively, formed in respective bottom surfaces 238, 242, 244 thereof. The plurality of openings 228, 232, 234 are configured to deliver a process gas from each of the segments 130, 166, and 168 into the process chamber 102. The plurality of openings 226, 228, 232, 234 may be arranged in any pattern suitable for uniformly depositing process materials onto the substrate 114. In some embodiments, the plurality of openings 226, 228, 232, 234 have a diameter of about 0.1 mm to about 3 mm.

The showerhead 116 and lid plate 210 include a plurality of feedthrough plates 218. The plurality of feedthrough plates 218 are configured to allow wires to pass from the showerhead 116 through the lid plate 210. The wires can be heater wires, sensor wires, or the like. In some embodiments, the each of the plurality of feedthrough plates 218 includes a plurality of openings 222. In some embodiments, a feedthrough plate 218 is disposed next to each of the plurality of segments 122, 130, 166, and 168. In some embodiments, one or more heater wires 206 (one shown) are configured to pass through one of the feedthrough plates 218 and into the first segment 122.

The shields 127 are shown positioned about the showerhead 116. In FIG. 2, the shields 127 are divided into a plurality of shield structures that are surrounding surfaces of the showerhead 116 (with the exception of the bottom surfaces 236, 238, 242 and 244). A first shield structure 250 is disposed about the first segment 122. A second shield structure 252 is disposed about the second segment 130. A third shield structure 254 is disposed about the third segment 166. A fourth shield structure 256 is disposed about the fourth segment 168. Each of the shield structures 250, 252, 254 and 256 include a top wall and a center wall 129. Each of the center walls 129 are coupled to the top wall (not shown in FIG. 2) as well as a center wall 129.

Figure 3:
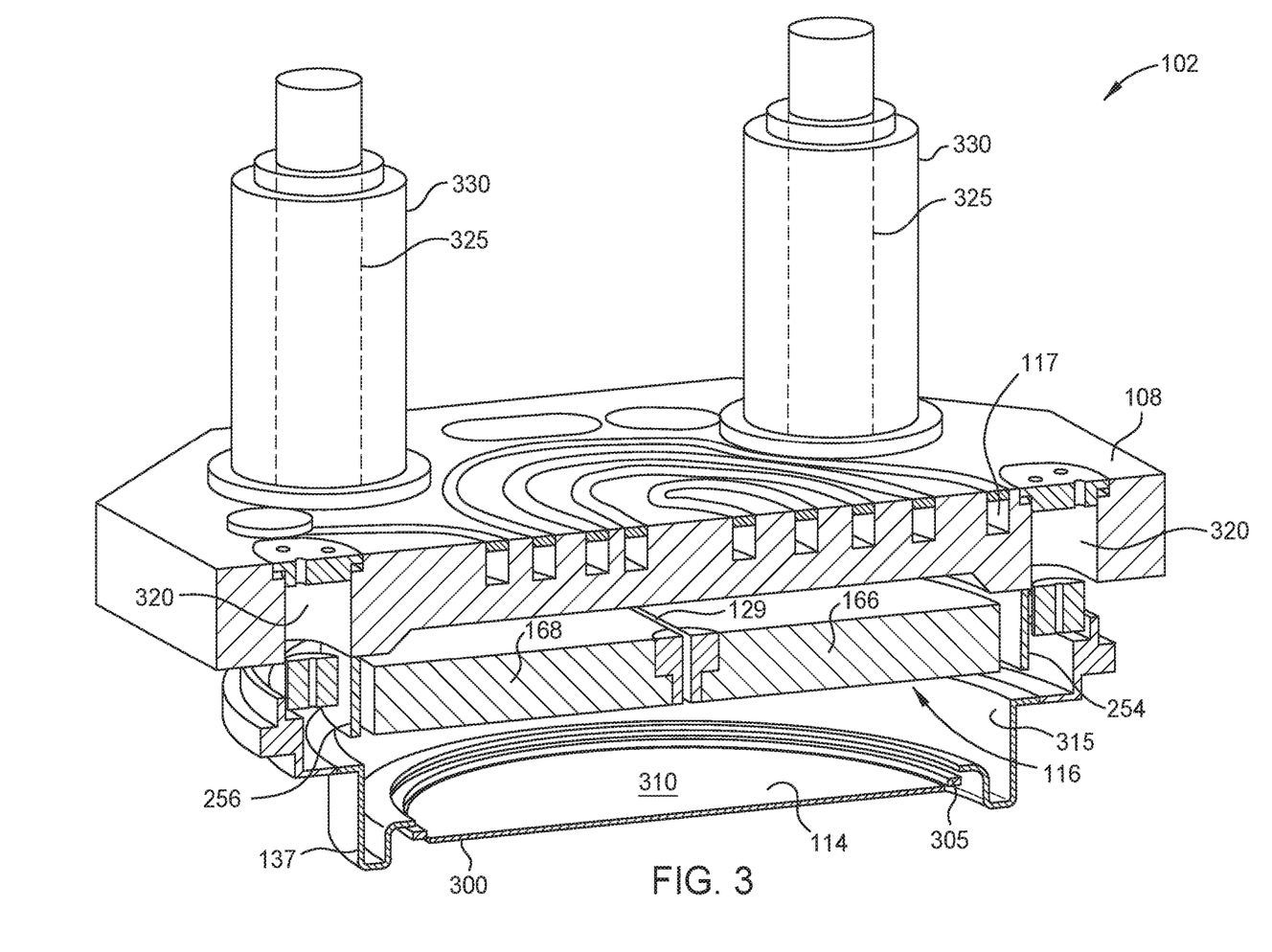
FIG. 3 is an isometric sectional view of a portion of the process chamber of FIG. 1.

FIG. 3 is an isometric sectional view of a portion of the process chamber 102 of FIG. 1. The chamber lid 108 is shown above the showerhead 116. The third shield structure 254 is disposed about the third segment 166 and the fourth shield structure 256 is disposed about the fourth segment 168. The center walls 129 of each of the third shield structure 254 and the fourth shield structure 256 separates the third segment 166 and the fourth segment 168.

The shroud 137 is surrounding the substrate 114, which is supported on a carrier 300. The carrier 300 would be supported on the pedestal 112 (not shown). A shadow mask 305 is at least partially overlying the substrate 114. The shadow mask 305 includes a plurality of fine openings that provide a pattern for deposition of films on the substrate 114.

The shroud 137 and the substrate 114 are in a processing position in FIG. 3. A process cavity 310 is formed between the showerhead 116, the substrate 114, and walls 315 of the shroud 137. The process cavity 310 confines deposition materials therein and minimizes deposition on chamber components outside of the process cavity 310.

The chamber lid 108 includes a plurality of vacuum pass-throughs 320 where temperature sensors and heater wires may be connected to the showerhead 116. The chamber lid 108 also includes inlets 325 each surrounded by a heating element 330 that provide vaporized material to the showerhead 116.

Figure 4:
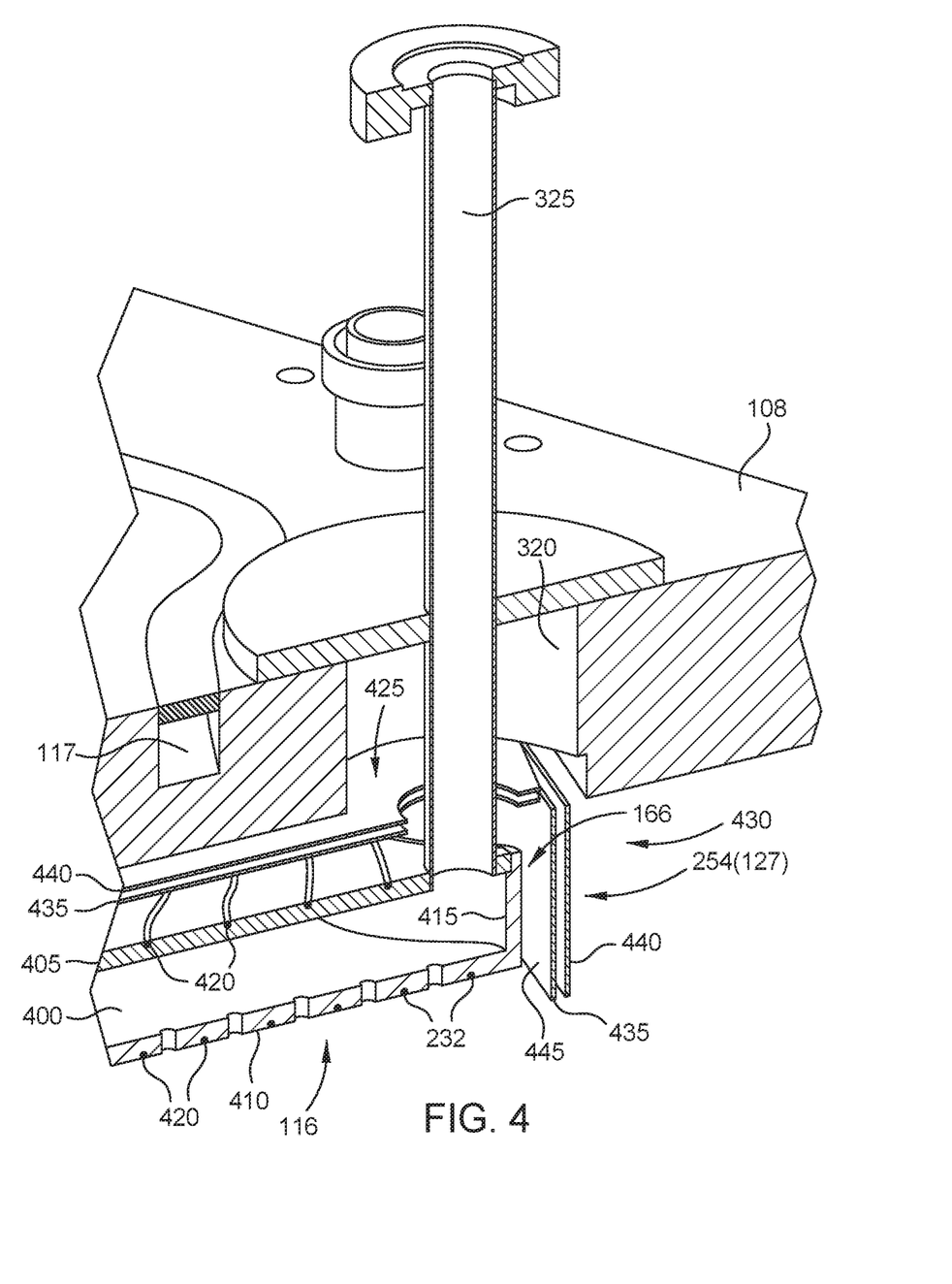
FIG. 4 is an isometric sectional view of a portion of the chamber lid and a portion of the showerhead.

FIG. 4 is an isometric sectional view of a portion of the chamber lid 108 and the third segment 166 of the showerhead 116. The inlet 325 is shown fluidly coupled to an interior volume 400 of the third segment 166 of the showerhead 116. The interior volume 400 is bounded by a monolithic top plate or upper wall 405, a perforated bottom plate or wall 410, and an edge wall 415. The perforated bottom wall 410 includes the openings 232 for delivering process gases to the substrate (not shown). The upper wall 405 as well as the perforated bottom wall 410 includes a plurality of heating elements 420 that heats the interior volume 400.

The third shield structure 254 includes a top wall 425 above the upper wall 405 and a side wall 430 adjacent to the edge wall 415. Each of the top wall 425 and the side wall 430 include a plurality of layers, shown as a first layer 435 and a second layer 440. While only two layers are shown, the top wall 425 and the side wall 430 may have more or less than two layers.

While the foregoing is directed to implementations of the present invention, other and further implementations of the invention may be devised without departing from the basic scope thereof, and the scope thereof is determined by the claims that follow.

We claim:

1. A system for processing a substrate, the system comprising:
   a process chamber comprising:
   a chamber body,
   a lid plate having a plurality of cooling channels formed therein, a rotatable pedestal, the rotatable pedestal having a plurality of cooling channels formed therein, and a showerhead disposed above the rotatable pedestal, the showerhead comprising a plurality of segments, each of the plurality of segments comprising an edge wall having a perimeter, and a plurality of shield structures, each of the plurality of shield structures made of a thermally conductive material that includes aluminum or stainless steel, and each of the plurality of shield structures comprising:

a top wall above a respective segment of the plurality of segments, and a side wall coupled to the top wall, the side wall surrounding a respective perimeter of the respective edge wall of a respective segment of the plurality of segments, wherein the side wall is disposed at least partially between the respective segment and adjacent segments of the plurality of segments;

a plurality of ampoules, each ampoule of the plurality of ampoules configured to deliver a material;

a plurality of ampoule heating elements, each ampoule heating element of the plurality of ampoule heating elements configured to heat a respective ampoule of the plurality of ampoules, a plurality of fluid delivery lines coupled to the showerhead; and one or more vacuum pumps coupled to the chamber body and each of the plurality of fluid delivery lines, wherein each respective fluid delivery line of the fluid delivery lines comprises:

a dedicated shut-off valve configured to flow the material to the showerhead, the dedicated shut-off valve operable in an open position and a closed position, and the dedicated shut-off valve positioned between:

the showerhead on a first side of the dedicated shut-off valve, and the respective ampoule and a respective ampoule heating element of the plurality of ampoule heating elements on a second side of the dedicated shut-off valve, a dedicated by-pass valve positioned between the dedicated shut-off valve and the one or more vacuum pumps, the dedicated by-pass valve operable in a by-pass open position and a by-pass closed position, wherein:

the dedicated by-pass valve of each of the fluid delivery lines is positioned between the showerhead and the one or more vacuum pumps and between the one or more vacuum pumps and a downstream side of the dedicated shut-off valve of the respective fluid delivery line, and at least one vacuum pump of the one or more vacuum pumps is configured to remove at least a portion of the material from at least a portion of the showerhead and at least a portion of the respective fluid delivery line disposed between the showerhead and the downstream side of the dedicated shut-off valve of the respective fluid delivery line when the dedicated shut-off valve is in the closed position and the dedicated by-pass valve is in the by-pass open position.

2. The system of claim 1, wherein each of the fluid delivery lines is coupled to one of the plurality of segments of the showerhead, one or more gaps are disposed between the plurality of segments, and the side walls of at least two shield structures are disposed in each of the one or more gaps to separate the plurality of segments.

3. The system of claim 2, wherein each of the plurality of segments comprises:

a first wall;

a plurality of openings formed in the first wall;

a second wall opposing the first wall; and an inlet formed in the second wall, wherein the inlet is disposed outwardly of the plurality of openings.

4. The system of claim 3, further comprising a shroud coupled to the lid plate, the shroud surrounding the showerhead and the rotatable pedestal, wherein:

the shroud includes a reflective surface that has a reflectivity of about 0.2 to about 0.5; and each of the plurality of shield structures includes an inner surface that has a reflectivity of about 0.1 to about 0.2.

5. The system of claim 4, wherein the lid plate comprises a plurality of mounts extending relative to a bottom surface of the lid plate, each of the plurality of segments comprises one or more mounts extending relative to the edge wall, and the mounts of the plurality of segments mate with the plurality of mounts of the lid plate to couple the showerhead to the lid plate.

6. The system of claim 1, wherein each of the plurality of shield structures includes an inner surface that has a reflectivity of about 0.1 to about 0.2.

7. The system of claim 1, wherein each of the plurality of shield structures comprises a plurality of layers made of the thermally conductive material.

8. The system of claim 7, wherein each segment of the plurality of segments is thermally separated by at least one shield structure of the plurality of shield structures.

9. The system of claim 7, wherein each segment of the plurality of segments is fluidly separated.

10. The system of claim 1, further comprising a shroud coupled to the lid plate, the shroud surrounding the showerhead and the rotatable pedestal.

11. The system of claim 10, wherein the shroud includes a reflective surface that has a reflectivity of about 0.2 to about 0.5.

12. The system of claim 1, wherein each segment of the plurality of segments of the showerhead comprises a perforated plate spaced apart from a top plate defining an interior volume therebetween.

13. The system of claim 12, wherein the top wall is above the top plate of the respective segment.

14. The system of claim 1, wherein each of the fluid delivery lines is heated and the system further comprises:

a plurality of push gas source assemblies, each respective push gas source assembly of the plurality of push gas source assemblies configured to deliver a push gas to the respective ampoule, the respective ampoule and the respective ampoule heating element positioned between the respective push gas source assembly and the showerhead.

15. The system of claim 1, wherein the plurality of shield structures include a plurality of layers.

16. The system of claim 1, wherein the plurality of segments are fluidly isolated.

17. The system of claim 16, wherein the perimeter of the edge wall of each of the fluidly isolated segments of the showerhead is surrounded by the side wall of one of the plurality of shield structures.

* * * * *